(12) United States Patent
Chang et al.

(10) Patent No.: US 6,311,312 B1
(45) Date of Patent: Oct. 30, 2001

(54) METHOD FOR MODELING A CONDUCTIVE SEMICONDUCTOR SUBSTRATE

(75) Inventors: Keh-Jeng Chang, San Jose; Robert G. Mathews, Los Altos; Li-Fu Chang, Santa Clara; Xu Yang, Sunnyvale, all of CA (US)

(73) Assignee: Sequence Design, Inc., Santa Clara, CA (US)

( * ) Notice: Subject to any disclaimer, the term of this patent is extended or adjusted under 35 U.S.C. 154(b) by 0 days.

(21) Appl. No.: 09/405,510

(22) Filed: Sep. 23, 1999

(51) Int. Cl.[7] .................................................. G06F 17/50
(52) U.S. Cl. ................................................ 716/5; 716/10
(58) Field of Search ................................................ 716/5, 10

(56) References Cited

U.S. PATENT DOCUMENTS 5,831,870 * 11/1998 Folta et al. .............................. 716/10
5,838,582 * 11/1998 Mehrotra et al. ....................... 716/10
5,901,063   5/1999 Chang et al. ........................... 716/10
6,086,238 * 7/2000 Mehrotra et al. ....................... 716/10

* cited by examiner

Primary Examiner—Trong Phan
(74) Attorney, Agent, or Firm—Skjerven Morrill MacPherson LLP

(57) ABSTRACT

A method models conductive regions of a semiconductor substrate in conjunction with conductors in the interconnect structures above the semiconductor substrate. Such a method allows highly accurate extraction of capacitance in planar (e.g., shallow trench isolation) and non-planar (e.g., thermal oxide isolation) semiconductor structures. This method is particularly applicable to modeling dummy diffusion regions prevalent in shallow trench isolation structures. An area-perimeter approach simplifies calculation of capacitance without using a 3-dimensional electric field solver. A method is also provided for extracting a capacitance associate with a contact, or a connecting conductor between two conductor layers.

14 Claims, 5 Drawing Sheets

METHOD FOR MODELING A CONDUCTIVE SEMICONDUCTOR SUBSTRATE

BACKGROUND OF THE INVENTION

1. Field of the Invention

The present invention relates to a method for modeling a semiconductor structure. In particular, the present invention relates to a method for modeling capacitance in conductive regions in a semiconductor substrate.

2. Discussion of the Related Art

Accurate extraction of impedance (e.g., capacitance) is essential for evaluating and predicting the performance of an integrated circuit manufactured under a given manufacturing process. Accurate values of impedance can be obtained only with accurate modeling of semiconductor structures manufactured under that process. A number of techniques for accurate extraction of impedance from interconnect structures of a semiconductor structure are disclosed in U.S. Pat. No. 5,901,063 (the "'063 Patent"), entitled "System and Method for Extracting Parasitic Impedance From an Integrated Circuit Layout," Ser. No. 08/804,524, filed on Feb. 21, 1997, issued on May 4, 1999, and assigned to Frequency Technology, Inc., which is also the Assignee of the present application. The disclosure of the '063 Patent is hereby incorporated by reference in its entirety.

FIGS. 1a and 1b depict corresponding cross-sectional and top views of a typical CMOS semiconductor structure 100 using a conventional thermal oxide isolation technique, showing only two conductor layers 101 and 102 above the substrate. In more recent integrated circuit processes, the number of conductor layers is typically more numerous than is shown in FIGS. 1a and 1b, often consisting of multiple layers of polysilicon and metal. FIGS. 1a and 1b show two conductor layers merely for illustrative purposes. As shown in FIGS. 1a and 1b, a semiconductor substrate 106 includes doped regions 106a and 106b of opposite conductivities, forming a P-well and an N-well for forming N-channel and P-channel transistors respectively. Thermal oxide regions 103a, 103b, 103c and 103d are provided to electrically isolate semiconductor regions 108a, 108b and 108c from each other. Thermal oxide regions 103a–103d are typically formed by the well-known LOCOS process that oxidize the substrate silicon surface at high temperature. Devices, such as transistors and capacitors, are formed within the semiconductor regions.

The first conductor layer 101 above substrate 106 is used to provide both device electrodes and interconnect conductor traces between device electrodes. For example, in FIGS. 1a and 1b, conductors 101b, 101c and 101e may be used as gate electrodes, and conductors 101a and 101d can be used as interconnect conductor traces. Conductor layer 101 is typically provided by doped polysilicon. Conductor layer 101 is isolated from substrate 106 by one or more dielectric layers 111. Conductors 101a and 101d are routed over thermal oxide regions 103a and 103c. To form diffusion (e.g., source and drain regions for an active device) regions, a well-known self-aligned process step introduces impurities ("dopants") into the regions 104a, 104b, 104c, 104d, 104e and 104f, using interconnect conductor layer 101 as a masking layer.

A layer of dielectric 109 is provided to isolate conductor layer 101 from conductor layer 102. Conductor layer 102 can be provided by either polysilicon or metal. Openings in dielectric layers 109 and 111 are provided and filled with a conductive material 105 to electrically connect (as "contacts") conductors in conductor layer 101 or diffusion regions 104 with conductors in conductor layer 102. For example, contacts 105a and 105b are provided to connect conductors 102a and 102b to diffusion regions 104a and 104b, and contacts 105c and 105d are provided to electrically connect conductors 102c and 102e to conductors 101c and 101e, respectively.

Because thermal oxide (e.g., thermal oxide formed under the LOCOS process) is much thicker than the portion of silicon substrate from which the thermal oxide is formed, thermal oxidation results in an undulating surface topography at the surface of the substrate, as shown in Figure 1a. Subsequent growth or depositions of materials, such as dielectric layers 111, conductor 101 and dielectric layer 109, are typically conformal to this surface topography, as can be seen in FIG. 1a. In the prior art, the capacitance in an active area between an electrode and a conductive portion of the substrate (e.g., a source or a drain region) is evaluated with the operation of the active device, and a capacitance between a conductor line in the "field region" (e.g., thermal oxide regions 103a and 103c) and a conductive portion of the substrate is simply ignored because of the width of the field region. Under thermal oxide isolation, the width of the field region is relatively large because of the so-called bird's beak structure (e.g., bird's beak 112).

Recently, the width of the field region is greatly reduced by using deposited oxide isolation. One deposited oxide isolation technique is known as "shallow trench isolation" (STI), which is illustrated by FIGS. 2a and 2b. FIGS. 2a and 2b depict corresponding cross-sectional and top views of a semiconductor structure 200, which includes two interconnect conductor layers 201 and 202. (To simplify discussion of the figures, like reference numerals are provided like features). Unlike semiconductor structure 100, however, rather than providing thermal oxide regions 103a–103d, shallow trenches are etched in substrate 106 to isolate areas 108a, 108b and 108c. An oxide is then deposited over the surface of substrate 106 and to fill the trenches. A chemical-mechanical polishing (CMP) step planarizes the surface of substrate 106 by polishing the deposited oxide away from the surface of substrate 106, thus providing the filled STI trenches 203a, 203b, 203c and 203d. Dielectric layers 111, 109 and 110, conductor layers 201 and 202, and contacts layer 105 can be provided in substantially the same manner as dielectric layers 111, 109 and 110, conductor layers 101 and 102 and contacts layer 105, respectively, as discussed above with respect to FIGS. 1a and 1b. Alternatively, after each layer of conductor material (i.e., conductor layers 201 and 202) is deposited, a CMP step can be applied to planarize the resulting surface, as shown in FIG. 2a.

Because STI trenches 203a–203d can be made much narrower than corresponding thermal oxide regions 103a–103d, capacitance between a conductor in the first conductor layer 201 (e.g., conductor 201a or 201d) and a conducting portion of the substrate(e.g., any of diffusion regions 104a, 104c–104f) can no longer be ignored. In addition, even though one goal of CMP is to provide a completely planarized surface, because of selectivity of the process and local non-uniformity, "dishing" can often occur. At submicron feature sizes, to achieve high performance, accurate extraction of impedance can be achieved only with accurate modeling of the conductor layers and the substrate.

SUMMARY OF THE INVENTION

In accordance with the present invention, a method extracts capacitance in a semiconductor structure including a substrate, and two or more conductor layers above the substrate. The method includes (a) computing the capacitance between each conductor in the conductor layers and conductors in the proximity of the conductor, without regard to any conductor that is in the substrate; (b) grouping the conductors in the conductor layers with the conductors in the substrate; and (c) computing the capacitance between each of the conductors in the conductor layers and the conductors within the substrate. An example of a conductor in the substrate is a diffusion region. The method of the present invention is applicable to conductive layers of polysilicon.

According to one embodiment, the capacitance between each conductor in the conductor layers and the conductors within the substrate is provided by an area-perimeter approximation. In one implementation, the area-perimeter approximation computes, for each conductor in the conductor layers overlapping a conductor in the substrate in an area, a parallel plate capacitance between the conductor in the conductor layers and the conductor in the substrate. Further, the area-perimeter approximation can include a capacitance between a lateral face of either one of the overlapping conductors along an edge of the area and a horizontal surface of the other one of the overlapping conductors. The same treatment can be given for capacitances between a lateral face of a conductor and a conductive region in the substrate. Alternatively, a 3-dimensional field server can be provided for even higher accuracy in calcuating the capacitance.

According to another aspect of the present invention, a method approximates the capacitance between a contact conductor and a conductor in a first conductor layer, the contact conductor being provided between a conductor in a second conductor layer and a diffusion region in the substrate. That method includes: (a) in a computer model, creating an open circuit between the contact conductor and the diffusion region by creating a gap between the contact conductor and the diffusion region; and (b) solving, using a 3-dimensional electric field solver, the capacitance between the contact conductor and the conductor in the first conductor layer. An alternative method includes: (a) in a computer model, replacing the contact conductor with a second conductor in the first conductor layer of comparable dimensions as the replaced contact conductor; and (b) computing a capacitance between the first and second conductors in the first conductor layer.

The present invention is better understood upon consideration of the detailed description below and the accompanying drawings.

BRIEF DESCRIPTION OF THE DRAWINGS

FIG. 7 illustrates a method by which capacitance $C_{CP}$ and capacitance $C_{CS}$, corresponding respectively to the capacitance between contact 105a and conductor 201b, and the capacitance between contact 105a and substrate 106a.

To simplify the detailed description and to highlight corresponding elements in the figures, like reference numerals are assigned to like features.

DETAILED DESCRIPTION OF THE PREFERRED EMBODIMENTS

The present invention provides an accurate model to allow extraction of capacitance in planar (e.g., STI) and non-planar (e.g., thermal oxide isolation) semiconductor structures. The present invention is especially applicable to STI structures which includes "dummy" diffusion regions. Dummy diffusion regions are semiconductor regions between oxide-filled trenches. These semiconductor regions minimize dishing by limiting the length of the trenches, rather than to be used as source or drain regions. Because the first conductor layer above the silicon substrate is used as a masking layer during the introduction of impurities to form source and drain regions, exposed semiconductor regions become source and drain regions in active areas, and dummy diffusion areas outside the active areas.

Figure 3:
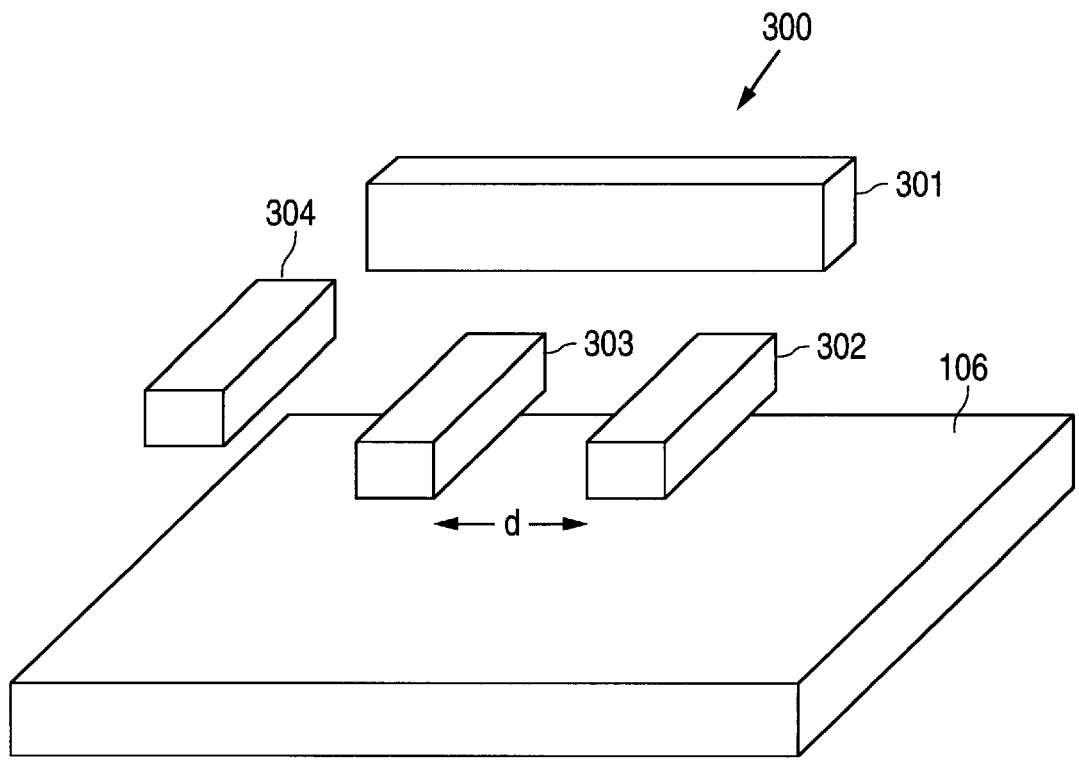
FIG. 3 shows a configuration of conductors that includes conductor 301 in a conductor layer $Mi_{i+1}$, conductor 304 in a conductor layer $M_I$, and conductors 302 and 303 in a conductor layer $M_{I-1}$.

One embodiment of the present invention uses a two-step process. First, capacitance for each interconnect conductor in each conductor layer above the substrate is extracted without consideration of the diffusion regions. This extraction can be accomplished, for example, using the method disclosed in the '063 Patent incorporated by reference above. The method disclosed in the '063 Patent maps each conductor in the layer being analyzed ("LBA") and the neighboring conductors in the same conductor layer and the conductor layers immediately above and below the LBA to a "bin" representing a configuration of conductors having its parasitic capacitances already characterized and parameterized (e.g., using the well-known field solver "Raphael"). FIG. 3 illustrates this approach. As shown in FIG. 3, a configuration of conductors includes conductor 301 in a conductor layer $M_{I+1}$, conductor 304 in a conductor layer $M_i$, and conductors 302 and 303 in a conductor layer $M_{i-1}$. In this method disclosed in the '063 Patent, substrate 106 is a conducting plane. In one implementation of the method disclosed in the '063 Patent, capacitance is calculated based on, among other parameters, the separation "d" between adjacent conductors in the LBA. A table of capacitance values is provided for various values of separation "d". In one instance, for example, capacitance per micron is shown to range between 50–100 aF per micron length, depending on the value of "d".

Figure 1A:
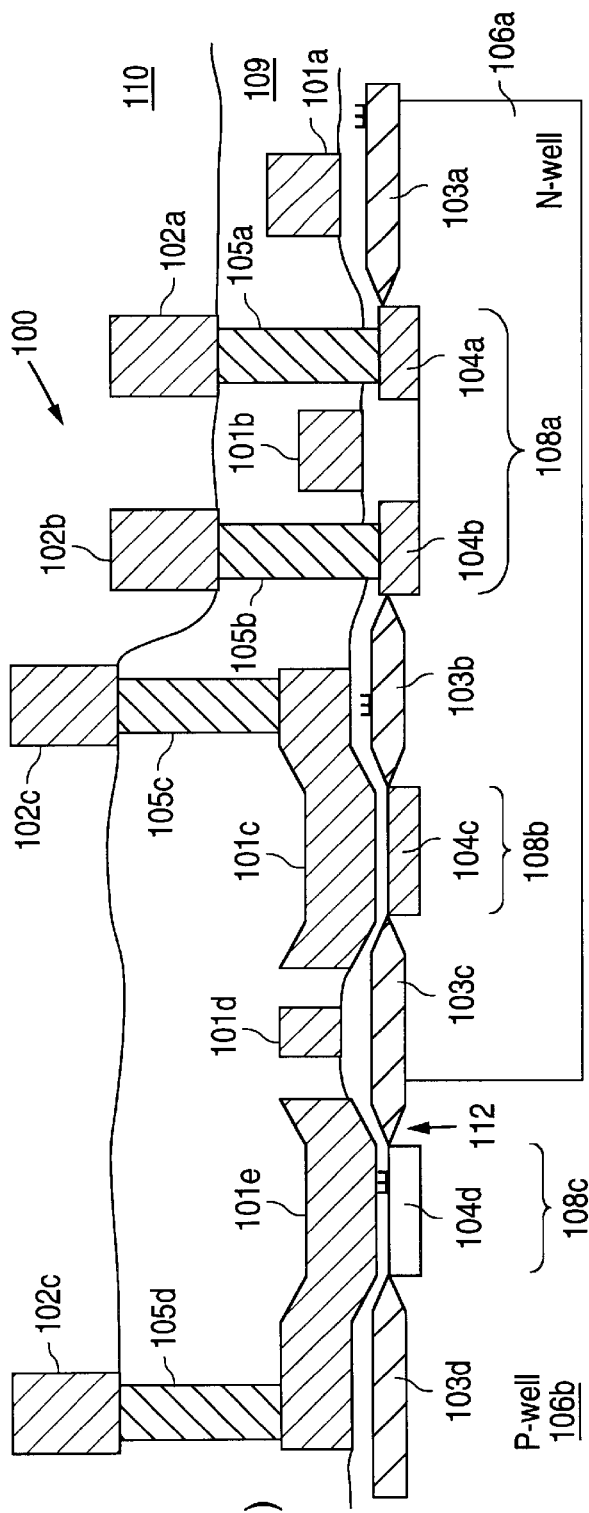
FIGS. 1a and 1b depict corresponding cross-sectional and top views of a semiconductor structure 100 formed using a conventional thermal oxidation technique; semiconductor structure 100 includes two interconnect conductor layers 101 and 102.
Figure 1B:
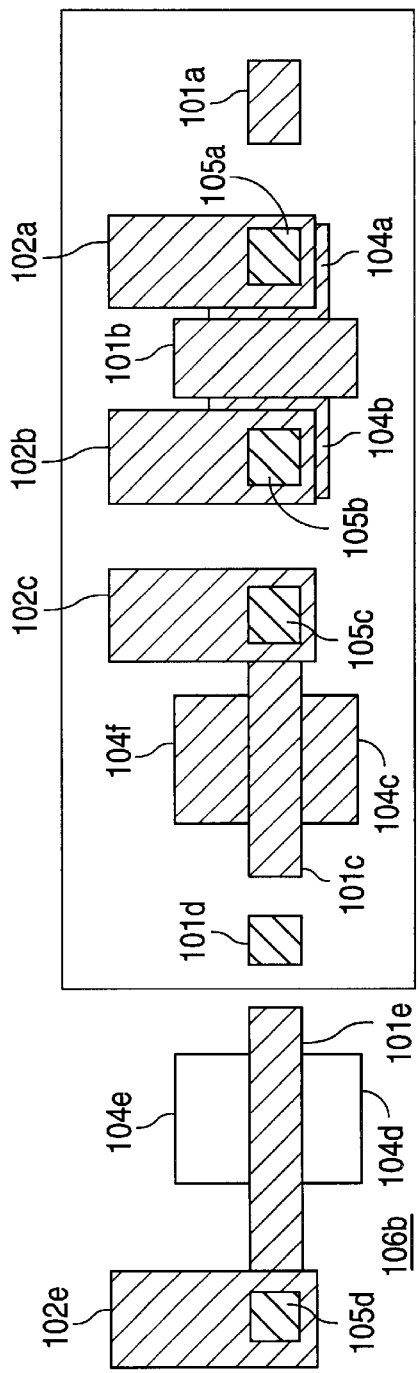
Figure 2A:
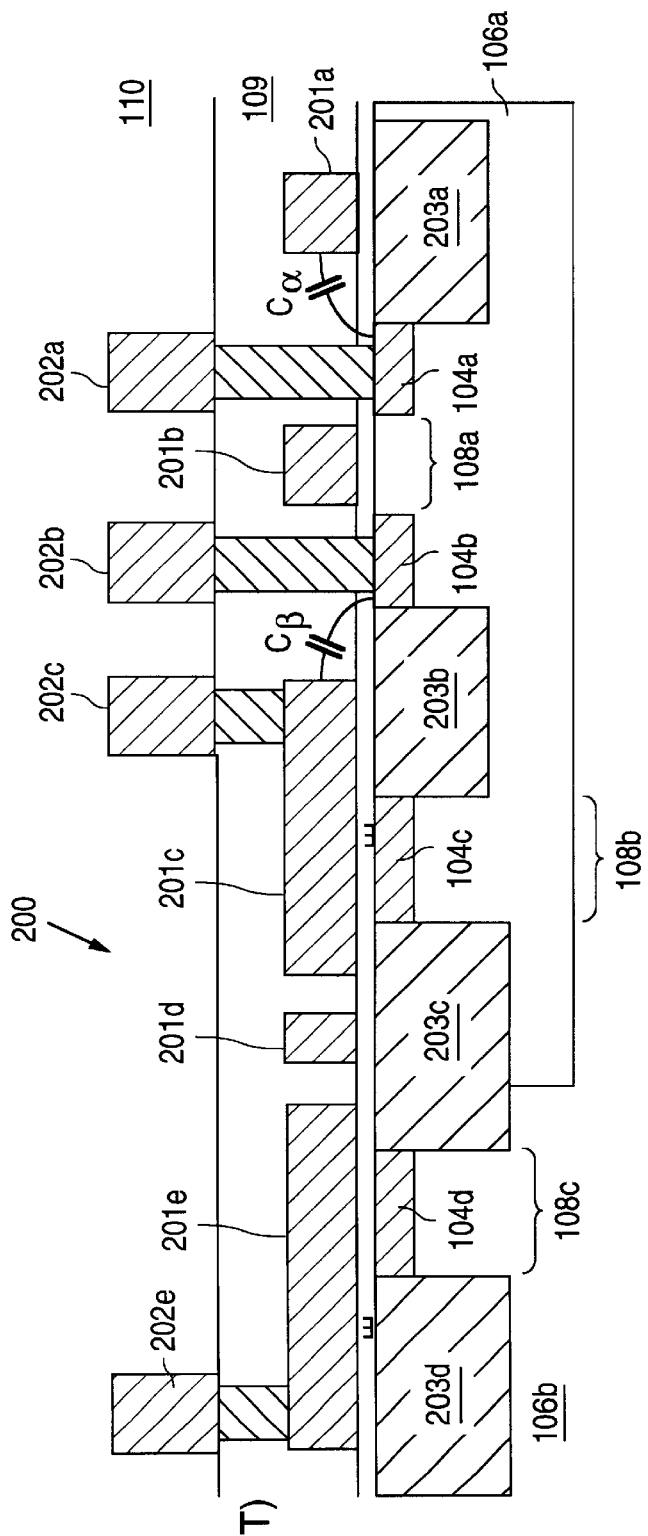
FIGS. 2a and 2b depict corresponding cross-sectional and top views of a semiconductor structure 200 formed using a shallow trench isolation (STI) technique; semiconductor structure 200 includes two interconnect conductor layers 201 and 202.
Figure 2B:
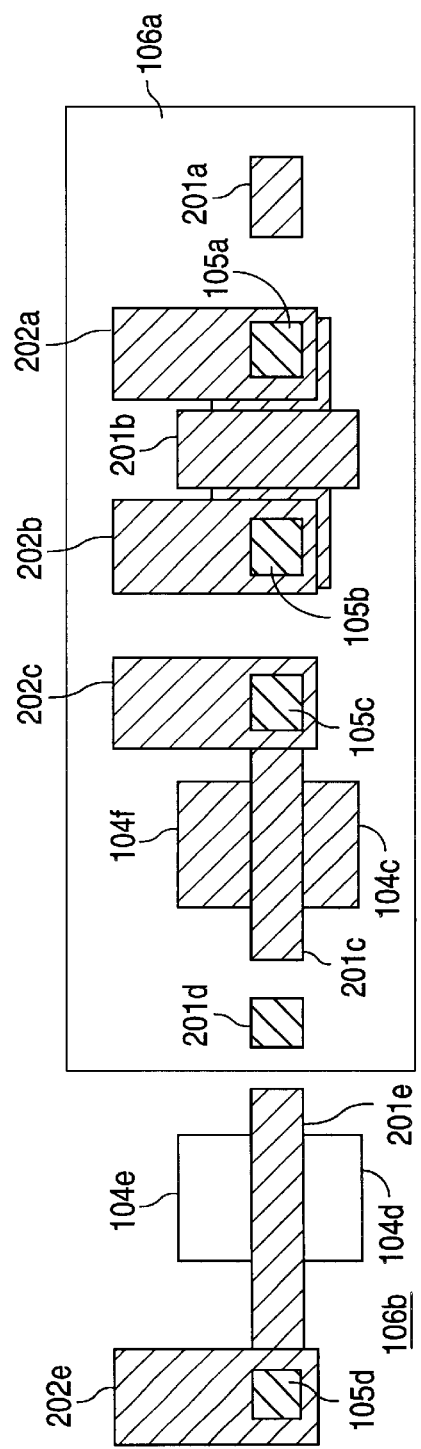
Figure 4:
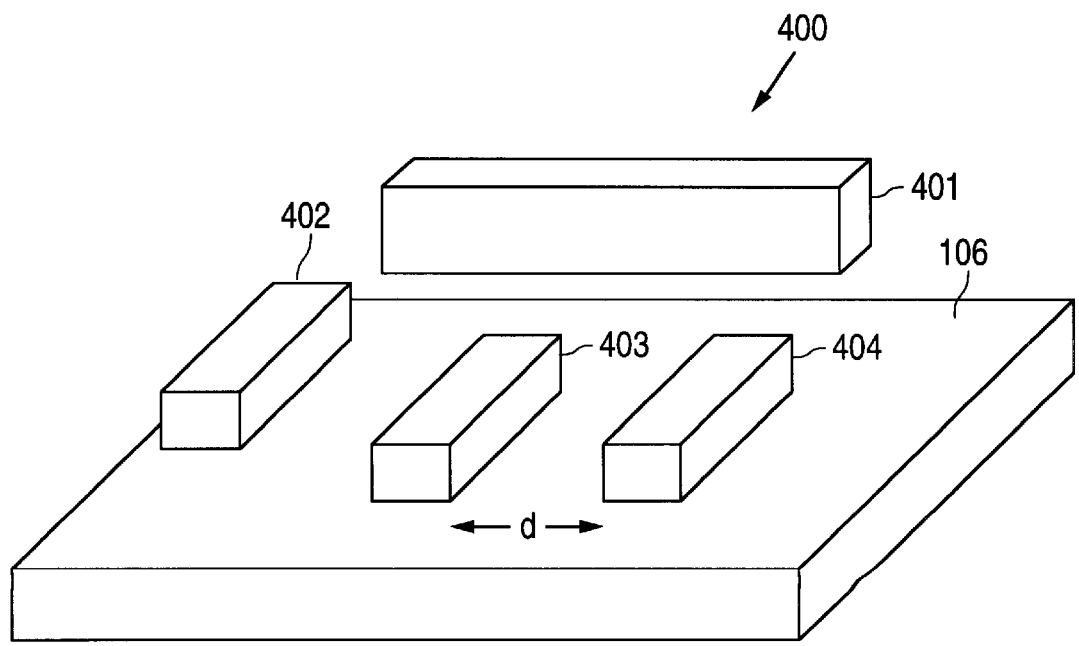
FIG. 4 depicts a configuration 400 of conductors including conductors 401 and 402 immediately above substrate 106, and diffusion regions 403 and 404 in substrate 406.

Next, when calculating the capacitances for the conductors in the first conductor layer above the substrate (e.g., layer 201 of FIG. 2), the diffusion regions are treated like any conductor (i.e., the STI trenches or the thermal oxide regions are treated like insulators). However, since it was found that capacitances between a conductor in the first conductor layer above the substrate and the diffusion regions vary only over a range of 35–50 aF per micron length, for a wide range of separations "d", the dependence on separation "d" is disregarded. FIG. 4 depicts a configuration 400 of conductors including conductors 401 and 402 immediately above substrate 106, and diffusion regions 403 and 404 in substrate 106. In this embodiment, each capacitance in the conductor layers immediately above the LBA (obtained in the first step using the method disclosed in the '063 Patent) is corrected by an area-perimeter approximation, rather than a 3-D field solution.

Figure 5:
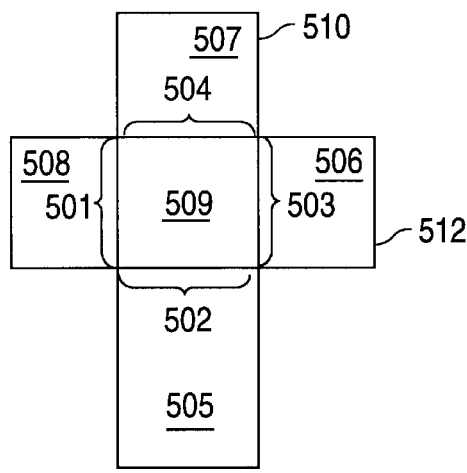
FIG. 5 shows overlapping top conductor 510 and bottom conductor 512 of the two conductor layers immediately above the substrate, respectively.

One area-perimeter approximation for overlapping conductors (as seen from the top view) is illustrated by FIG. 5. FIG. 5 shows top conductor 510 and bottom conductor 512 of the two conductor layers immediately above the substrate, respectively. Conductors 510 and 512 overlap over an area defined by edges 501, 502, 503 and 504, respectively, corresponding to capacitance $C_{st1}$ between the side face of conductor 510 along edge 501 facing area 508 on the top face of conductor 512, capacitance $C_{sb1}$ between the side face of conductor 512 along edge 502 facing area 505 on the bottom face of conductor 510, capacitance $C_{st2}$ between the side face of conductor 510 along edge 503 facing area 506 on the top face of conductor 512, and capacitance $C_{sb2}$ between the side face of conductor 512 along edge 504 facing area 507 on the bottom face of conductor 510. Capacitance $C_{over}$ in overlap region 509 can be approximated by the capacitance of a parallel plate capacitor. As far as capacitance per unit length is concerned, $C_{sb2}$ equals $C_{sb1}$, while $C_{st1}$ equals $C_{st2}$.

Capacitances corresponding to non-overlapping conductors, e.g., capacitance $C_\hat{a}$ between an end face of conductor 201c and diffusion region 104b and capacitance C ȧ between a side face of conductor 201a and diffusion region 104a, are also calculated. These capacitances (i.e., capacitances $C_{st1}$, $C_{sb1}$, $C_{over}$, $C_\alpha$ and $C_\beta$, collectively, "delta capacitances") are used to correct the capacitances of the two conductor layers immediately above the substrate computed under the method of the '063 Patent.

Figure 6A:
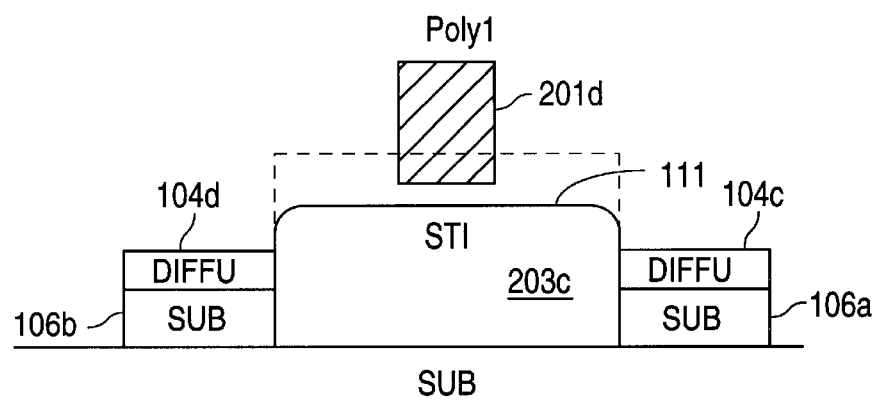
FIGS. 6a, 6b and 6c show the raised, recessed and flat STI trench topographies modeled in one embodiment of the present invention.
Figure 6B:
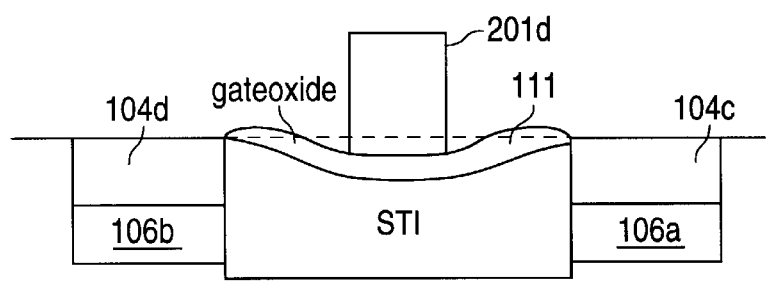
Figure 6C:
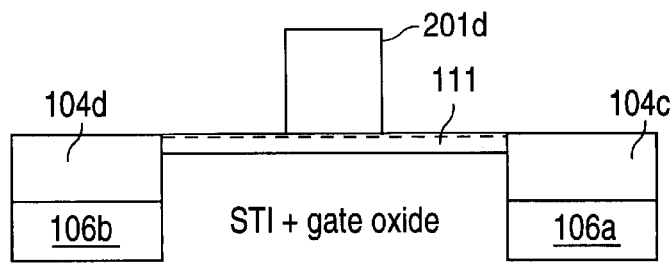

The area-perimeter approach does not require the 3-D geometry search used in the method of the '063 Patent. Further, look-up tables under the present invention are much smaller than those used in the method of the '063 Patent. It is found that the area-perimeter approach is sufficiently accurate for modeling capacitance between the interconnect conductor layers above the substrate and the diffusion regions. To correct for the local topography, different empirically determined look-up tables can be provided for calculating the delta capacitances. In one embodiment, three lookup tables corresponding to the raised, recessed and flat topographies of the STI trenches, respectively, are provided. These topographies are illustrated by FIGS. 6a, 6b and 6c.

Figure 7:
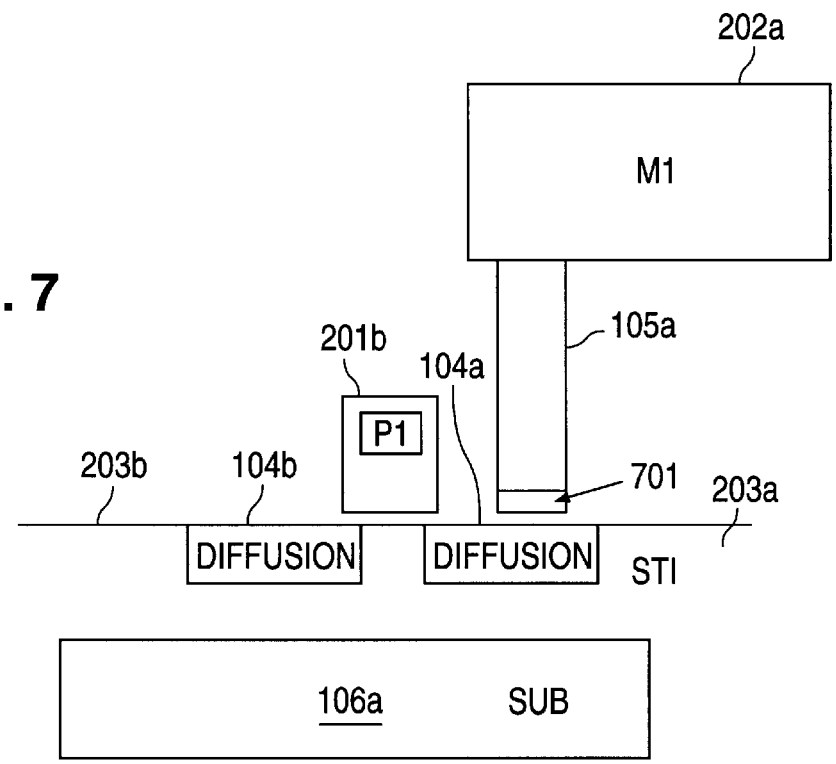

FIG. 7 illustrates a method by which capacitance $C_{CP}$ and capacitance $C_{CS}$, corresponding respectively to the capacitance between contact 105a and conductor 201b, and the capacitance between contact 105a and substrate 106a. FIG. 7 differs from the corresponding portion of FIG. 2 by showing a gap (i.e., creating an open circuit) between contact 105a and diffusion region 104a. With gap 701, the potentials on conductor 201b, substrate 106a and contact 105a are independently determined in well–known field solvers such as "Raphael." Consequently, the capacitances $C_{CP}$ and $C_{CS}$ are obtained. One needs only discard the capacitance $C_{CD}$, which is merely the artifact capacitance created by the artificial open circuit between contact 105a and diffusion region 104a.

Figure 8:
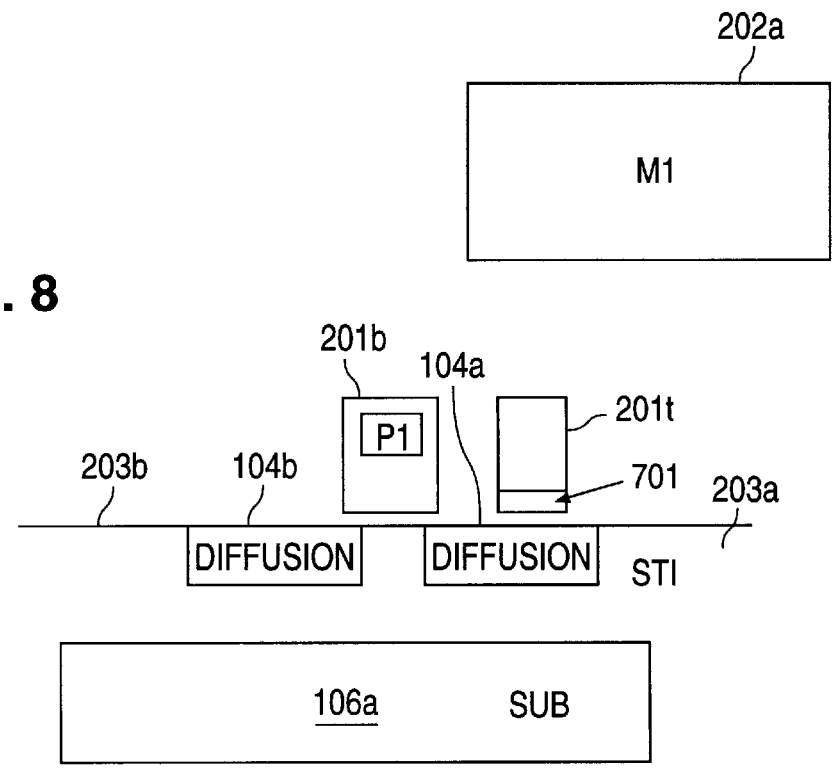
FIG. 8 shows an alternative method of FIG. 7.

Alternatively, same capacitances $C_{CP}$ and $C_C$ can be obtained by substituting contact 105a by an artificial conductor 201t of the layer 201, such as illustrated in FIG. 8. Capacitances $C_{CP}$ and $C_C$ can be obtained as the capacitance between conductors 201a and 201t, and the capacitance between conductor 201t and substrate 106a, using a field solver (e.g., Raphael), the method disclosed in the '063 Patent discussed above, or the area-perimeter method discussed above. Contact 201t can be created in a "virtual" masking layer in the artwork of the layout of semiconductor structure 200, substituting each of the contacts in layer 105 by an artificial conductor of the same drawn dimensions as the replaced contact in layer 105. Where there are more than one conductor layer between conductor 202a and diffusion region 104a, the method is slightly modified to include an artificial conductor of the same drawn dimensions for each conductor layer between conductor 202a and diffusion region 104a.

The detailed description above is provided to illustrate the specific embodiments discussed above, and is not intended to be limiting. Numerous variations and modifications within the present invention are possible. The present invention is set forth in the following claims.

We claim:

1. A method for extracting capacitance in a semiconductor structure including a substrate, a first conductor layer above said substrate, and a second conductor layer above said first conductor layer, said method comprising:
   computing the capacitance between each conductor in said first and second conductor layers and conductors in the proximity of said conductor without regard to any conductors in said substrate;
   grouping said conductors in said first and said second conductor layers with said conductors in said substrate; and
   computing the capacitance between each of said conductors in said first and second conductor layers and said conductors within said substrate.

2. A method as in claim 1, wherein said conductors in said substrate comprises diffusion regions.

3. A method as in claim 1, wherein said first conductor layer comprises polysilicon.

4. A method as in claim 1, wherein said step of computing the capacitance between each of said conductors in said first and second conductor layers and said conductors within said substrate comprises an area-perimeter approximation.

5. A method as in claim 4, wherein said area-perimeter approximation computes, for each conductor in said first and second conductor layers overlapping a conductor in said substrate at an area, a parallel plate capacitance between said conductor in said first and second conductor layers and said conductor in said substrate.

6. A method as in claim 5, wherein said area-perimeter approximation further computes a capacitance between a lateral face of either one of said overlapping conductors along an edge of said area and a horizontal surface of the other one of said overlapping conductors.

7. A method as in claim 1, wherein a capacitance in computed between an end face of a conductor in said first conductor layer and a conductor in said substrate.

8. A method as in claim 1, wherein a capacitance is computed between a side face of a conductor in said first conductor layer and a conductor in said substrate.

9. A method as in claim 1, wherein said step of computing the capacitance between each conductor in said first and second conductor layers and conductors in the proximity of said conductor without regard to said conductors in said substrate is accomplished using a 3-dimensional electric field solver.

10. A method for approximating the capacitance between a contact conductor and a conductor in a first conductor layer, said contact conductor being provided between a conductor in a second conductor layer and a diffusion region in said substrate, said method comprising:

in a computer model, creating an open circuit between said contact conductor and said diffusion region by creating a gap between said contact conductor and said diffusion region; and solving, using a 3-dimensional electric field solver, the capacitance between said contact conductor and said conductor in said first conductor layer.

11. A method for approximating the capacitance between a contact conductor and a first conductor in a first conductor layer, said contact conductor being provided between a conductor in a second conductor layer and a diffusion region in said substrate, said method comprising:

in a computer model, replacing said contact conductor with a second conductor in said first conductor layer of comparable dimensions as said replaced contact conductor; and computing a capacitance between said first and second conductors in said first conductor layer.

12. A method as in claim 11, wherein said computing step further computes a capacitance between said second conductor and said substrate.

13. A method for approximating the capacitance between a contact conductor and a first conductor in a first conductor layer, said contact conductor being provided between a conductor in a second conductor layer and a diffusion region in a substrate, and said first conductor layer being one of one or more intervening conductor layers between said second conductor layer and said diffusion region, said method comprising:

in a computer model, replacing said contact conductor by one or more conductors in said intervening layers, each of said one or more conductors being a conductor of comparable dimensions as said replaced contact conductor in a corresponding intervening layer; and computing a capacitance between said first conductor and the corresponding one of said one or more conductors in said first conductor layer.

14. A method as in claim 13, wherein said computing step further computes a capacitance between said corresponding one of said one or more conductors in said first conductor layer and said substrate.

* * * * *